United States Patent
Lovett

(10) Patent No.: US 8,670,286 B2
(45) Date of Patent: *Mar. 11, 2014

(54) LOCAL POWER DOMAINS FOR MEMORY SECTIONS OF AN ARRAY OF MEMORY

(75) Inventor: Simon J. Lovett, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/431,826

(22) Filed: Mar. 27, 2012

(65) Prior Publication Data

US 2012/0182820 A1 Jul. 19, 2012

Related U.S. Application Data

(63) Continuation of application No. 12/324,338, filed on Nov. 26, 2008, now Pat. No. 8,159,896.

(51) Int. Cl.
*G11C 5/14* (2006.01)
*G11C 8/00* (2006.01)
*G11C 8/10* (2006.01)

(52) U.S. Cl.
USPC .............. 365/226; 365/230.06; 365/230.01

(58) Field of Classification Search
USPC ............... 365/226, 230.01, 230.03, 230.06
See application file for complete search history.

(56) References Cited

U.S. PATENT DOCUMENTS

| 6,301,187 | B1 | 10/2001 | Ooishi et al. |
| 2003/0169631 | A1 | 9/2003 | Hidaka |
| 2007/0035987 | A1* | 2/2007 | Houston ............... 365/154 |
| 2007/0201295 | A1 | 8/2007 | Lines |

* cited by examiner

*Primary Examiner* — Hoai V Ho
*Assistant Examiner* — Tri Hoang
(74) *Attorney, Agent, or Firm* — Dorsey & Whitney LLP

(57) ABSTRACT

Memories, memory arrays, and methods for selectively providing electrical power to memory sections of a memory array are disclosed. A memory array can be operated by decoupling row decoder circuitry from receiving electrical power while the memory array is not being accessed. Portions of the memory array to be accessed are determined from external memory addresses and the row decoder for the portions of the memory array to be accessed are selectively provided with electrical power. The section of memory is then accessed. One such array includes memory section voltage supply rails having decoder circuits coupled to receive electrical power, and further includes memory section power control logic. The control logic selectively couples the memory section voltage supply rail to a primary voltage supply to provide electrical power to the memory section voltage supply rail in response to being selected based on memory addresses.

13 Claims, 3 Drawing Sheets

LOCAL POWER DOMAINS FOR MEMORY SECTIONS OF AN ARRAY OF MEMORY

CROSS-REFERENCE TO RELATED APPLICATION

This application is a continuation of U.S. patent application Ser. No. 12/324,338, filed Nov. 26, 2008, U.S. Pat. No. 8,159,896. This application is incorporated by reference herein in its entirety and for all purposes.

TECHNICAL FIELD

Embodiments of the invention relate generally to semiconductor memory circuits, and more particularly, in one or more of the illustrated embodiments, to semiconductor memory having a memory array with local power domains to provide electrical power to memory sections to be accessed.

BACKGROUND OF THE INVENTION

An array of memory cells is typically divided into banks of memory, with each of the banks further divided into sections of memory. The memory cells are typically arranged in rows and columns of memory, with a row of memory cells coupled to a respective word line. The columns of memory are coupled to sense amplifiers that sense data from accessed memory cells and amplify the sensed data to be provided over a read data path during read operations. The sense amplifiers are also used during write operations to capture the write data to be written to the memory cells. When selecting memory to access, row and column memory addresses are provided to row and column address decoders. The row decoders activate the word lines of the rows corresponding to the row address. Sense amplifiers are activated and data from the memory cells of the activated word lines are sensed and amplified. The data can be provided to the read data path for read operations or data can be written through the sense amplifiers to the memory cells of the selected rows.

FIG. 1 illustrates a portion 100 of a bank of memory. The portion 100 includes memory sections 110 and sense amplifier gaps 120 in which sense amplifiers shared by adjacent memory sections 110 are located. Row decoder and sense amplifier gap control logic coupled to the memory sections 110 and to sense amplifiers in the sense amplifier gaps 120 are used when accessing memory of the memory sections 110. As illustrated by the detailed section 160, row decoders 140 and sense amplifier gap control logic 130 are associated with respective memory sections 110 and sense amplifier gaps 120. The row decoders 140 selectively activate word lines of the respective memory section and the sense amplifier gap control logic 150 controls operation of the sense amplifiers located in the associated sense amplifier gaps 120 when memory cells of a respective memory section are accessed. Internal memory section address signals SEC1of8, SEC1of4 derived from the memory addresses of memory to be accessed are provided to the row decoders 140 and the sense amplifier gap control logic 150 to identify the memory sections to be accessed. In response to the SEC1of8, SEC1of4 signals indicating access to a particular memory section 110, the associated row decoder 140 and sense amplifier gap control logic 150 are used to carry out the access operation.

Circuits of the row decoders 140 and the sense amplifier gap control logic 150 are electrically connected to a voltage supply that provides power to the circuits. As known, however, even when the circuits of the row decoders 140 and the sense amplifier gap control logic 150 are not operating, for example, a memory access operation is not being performed, the circuits consume power due to leakage currents. A typical measure of power consumption while a memory is not operating is "standby current." The leakage currents result from the voltage difference between the voltage supply and ground that is placed across the circuits of the row decoders 140 and the sense amplifier gap control logic 150. The leakage currents for the individual circuits may be minor. The total leakage current for the circuits of all of the row decoders 140 and sense amplifier gap control logic 150 of a memory array, however, can nevertheless result in a sum power consumption that may be significant, especially when considering the memory is not operating. In many low power applications, such as in portable electronic systems that rely on battery power, reducing power consumption by the memory, including that consumed by the memory during "standby," is desirable.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
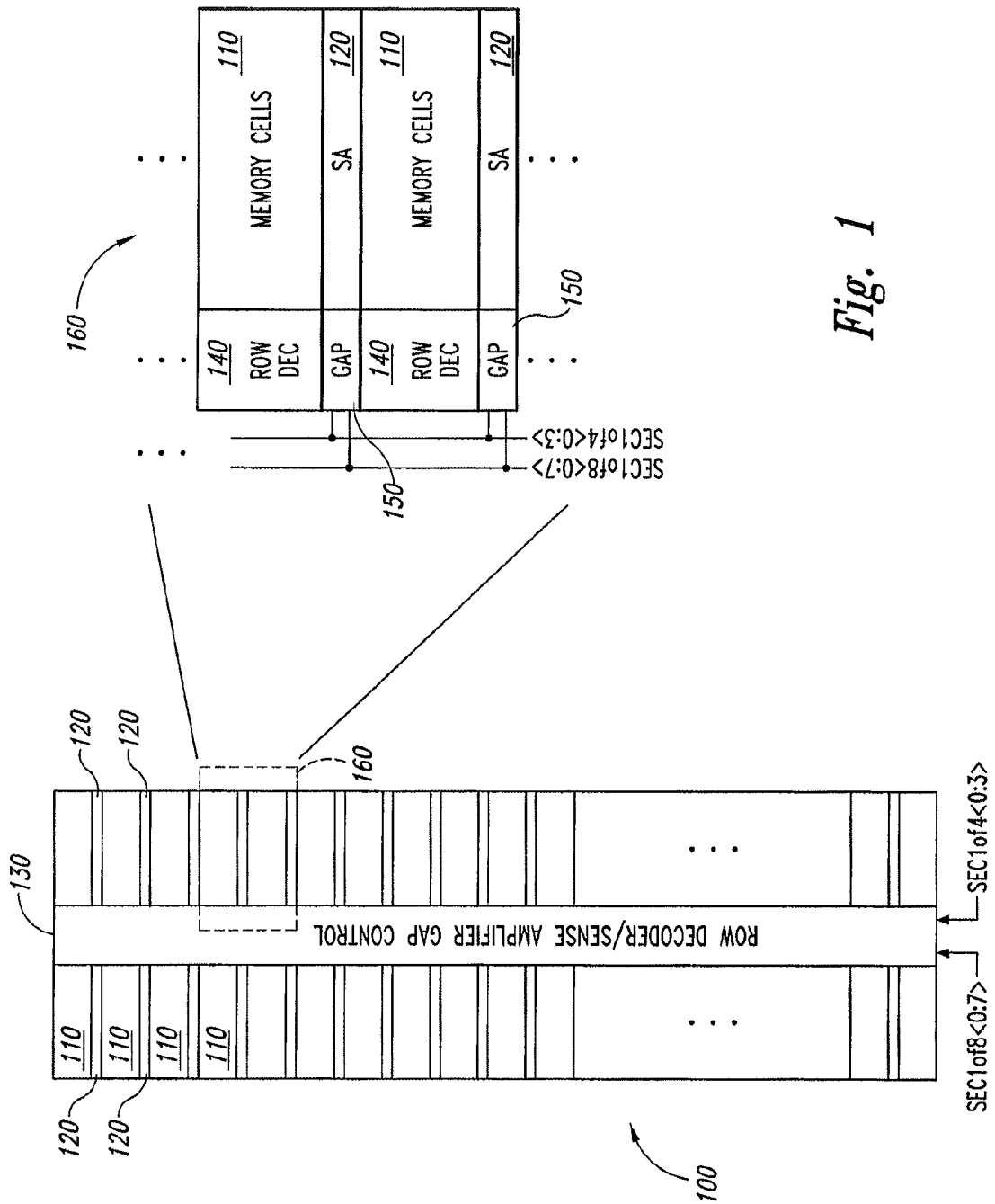
FIG. 1 is a block diagram of a portion of a bank of memory and an arrangement of sections of memory for a conventional memory.
Figure 2:
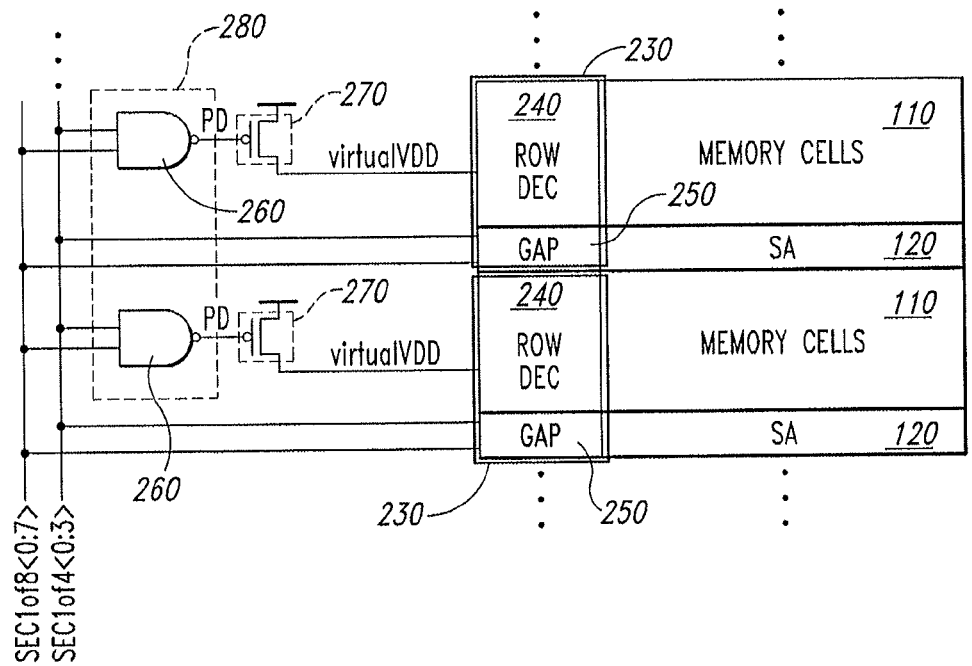
FIG. 2 is a block diagram of sections of memory according to an embodiment of the invention.

FIG. 2 illustrates a portion of a memory array according to an embodiment of the invention. In particular, FIG. 2 illustrates memory sections 110 having memory cells arranged in rows and columns, and sense amplifier gaps 120 in which sense amplifiers (not shown) are coupled to the columns of memory of the memory sections 110. Row decoders 240 are coupled to word lines of the memory section 110 and sense amplifier gap control circuits 250 are coupled to the sense amplifiers to control activation and deactivation of the sense amplifiers during an access operation. Memory section power control logic 280 are coupled to the row decoders 240 and the sense amplifier gap control circuits 250. The memory section power control logic 280 includes control logic 260 coupled to a switch 270 to selectively couple and decouple circuitry in the row decoders 240 and sense amplifier gap control logic to a voltage supply. As shown in FIG. 2, the control logic 260 and the switch 270 are shown as a NAND logic gate and a p-channel transistor, respectively.

As shown in FIG. 2, each memory section has a local power domain 230 that selectively provides electrical power to the access circuitry of the memory section, for example, to the row decoders 240 and the sense amplifiers and sense amplifier gap control circuits 250. A local power rail to which the access circuitry of a memory section are coupled, is selectively coupled and decoupled from a primary voltage supply according to whether the memory section is to be accessed. By decoupling the local power rail from the primary voltage supply, and consequently, the access circuitry of the memory section, while the memory section is not being accessed current consumption during standby can be reduced.

In operation, internal section address signals SEC1of8, SEC1of4 derived from external memory addresses of memory locations to be accessed are provided to the control logic 260. The control logic 260 for the memory sections identified by the SEC1of8, SEC1of4 signals as having the memory cells to be accessed generate a switch activation signal PD that controls the switch 270 to be conductive. In embodiments where the switch 270 is implemented as a p-channel transistor, such as that shown in FIG. 2, in response to the SEC1of8, SEC1of4 signals a PD signal having a LOW logic level is generated by the control logic 260 for the memory sections to be the accessed whereas the control logic 260 PD signal having a HIGH logic level is generated by the control logic 260 for the memory sections that are not accessed during the memory access operation. Upon completion of memory access operations to the memory section being accessed, the SEC1of8, SEC1of4 signals are driven to a logic level so that the control logic 260 for all of the memory sections generate a PD signal to deactivate the switch 270 and decouple the row decoders 240 and the sense amplifier gap control logic 250 from the supply voltage.

The memory section power control logic 280 may be used to decouple the circuitry of the row decoder 240 and the sense amplifier gap control logic 250 from the supply voltage when a memory operation does not involve memory access. The memory section power control logic 280 may also be used to selectively couple the circuitry of the row decoder 240 and the sense amplifier gap control logic 250 for the memory sections that are to be accessed during a memory access operation to the supply voltage, while having the unaccessed memory sections remain decoupled from the supply voltage. As a result, power consumption resulting from leakage currents through circuitry continuously connected to the supply voltage, even when the circuitry is inactive (i.e., standby current), may be reduced.

Figure 3:
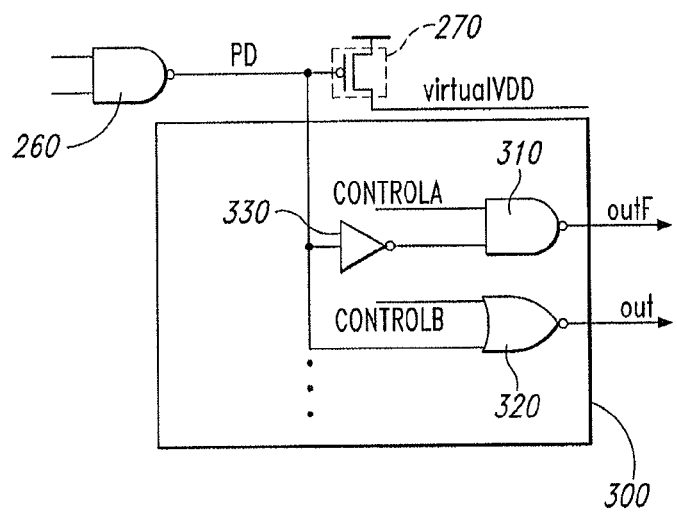
FIG. 3 is a block diagram of an isolation circuit according to an embodiment of the invention that may be used for the sections of memory of FIG. 2.

In some embodiments of the invention, various signals related to the operation of a memory section should be driven to a known logic level in order to fully deactivate operation of the memory section, including the row decoder 240 and the sense amplifier gap control circuit 250. FIG. 3 illustrates an isolation circuit 300 according to an embodiment of the invention that may be used with memory section power control logic, such as the memory section power control logic 280 of FIG. 2 to set the logic levels of the various signals for a memory section.

A portion of memory section power control logic is illustrated in FIG. 3. In particular, a two input NAND gate 260 is coupled to a switch 270 to provide a power down PD signal for controlling provision of a supply voltage through the switch 270. The isolation circuit 300 includes two-input NAND gate 310 and two-input NOR gate 320. An inverter 330 is coupled to receive the PD signal and provide an inverted signal to one of the inputs of the NAND gate 310. The NOR gate 320 also is coupled to receive the PD signal. The NAND gate 310 and the NOR gate 320 further receive control signals CONTROLA, CONTROLB, respectively, from upstream logic circuitry and generate output signals outF, out signals based on the logic levels of the PD signal and the CONTROLA, CONTROLB signals. The CONTROLA, CONTROLB signals may represent various known memory section control signals for controlling operation of circuitry in the row decoder 240 and sense amplifier gap control logic 250 during operation of the memory section, such as when the memory section is being accessed.

In operation, a LOW logic level PD signal controls the switch 270 to couple a supply voltage to the row decoder 240 and the sense amplifier gap control logic 250 for an access operation to the respective memory sections. The CONTROLA, CONTROLB signals are provided through the NAND and NOR gates 310, 320 to the circuitry of the row decoder 240 and the sense amplifier gap control logic 250. When the PD signal has a HIGH logic level, however, the switch 270 decouples circuitry of the row decoder 240 and the sense amplifier gap control logic 250 from the supply voltage, and the NAND and NOR gates 310, 320 output a HIGH logic level signal and a LOW logic level signal, respectively, regardless of the logic states of the CONTROLA, CONTROLB signals.

The out, outF signal provided by the isolation circuit 300 can be used to set inactive logic states of signals provided to the row decoder 240 and the sense amplifier gap control circuit 250, or signals driven by the row decoder 240 and the sense amplifier gap control circuit 250 when decoupled from a supply voltage. For example, word lines of the memory sections should be maintained at a LOW logic level to maintain storage of data states in the memory cells. The LOW output signal from the NOR gate 320 can be used as a LOW logic level signal to be driven onto the word lines in order to maintain data states while the row decoder 240 of a memory section are disconnected from the supply voltage.

In another example, when the sense amplifier gap control logic 250 is decoupled from the voltage supply, sense amplifier control signals should be driven to set logic levels to fully deactivate the sense amplifiers. For example, the sense amplifier control signals should be driven to a LOW logic level, a HIGH logic level, or a combination of the two in response to a HIGH PD signal. The out signal of the NOR gate 320, the outF signal of the NAND gate 310, or both the out, outF signals can be used to set the appropriate logic levels of sense amplifier control signals to fully deactivate the sense amplifiers while the supply voltage is decoupled from the sense amplifier gap control circuit 250.

In some embodiments of the invention, the outF, out signals are used directly as the signals to set inactive logic states. In other embodiments of the invention, the outF, out signals are provided to other circuits that generate signals from the outF, out signals that are used to set inactive logic states.

Previously described embodiments of the invention have a local power domain to connect and disconnect row decoder circuitry and sense amplifier circuitry for a memory section from a primary power supply. In other embodiments of the invention, however, a local power domain connects and disconnects either the row decoder circuitry or sense amplifier circuitry of a memory section from a primary power supply. In other embodiments of the invention, circuitry alternatively or additionally to the row decoder and/or sense amplifier circuitry local to a memory section are connected and disconnected from the primary power supply in the local power domain.

Figure 4:
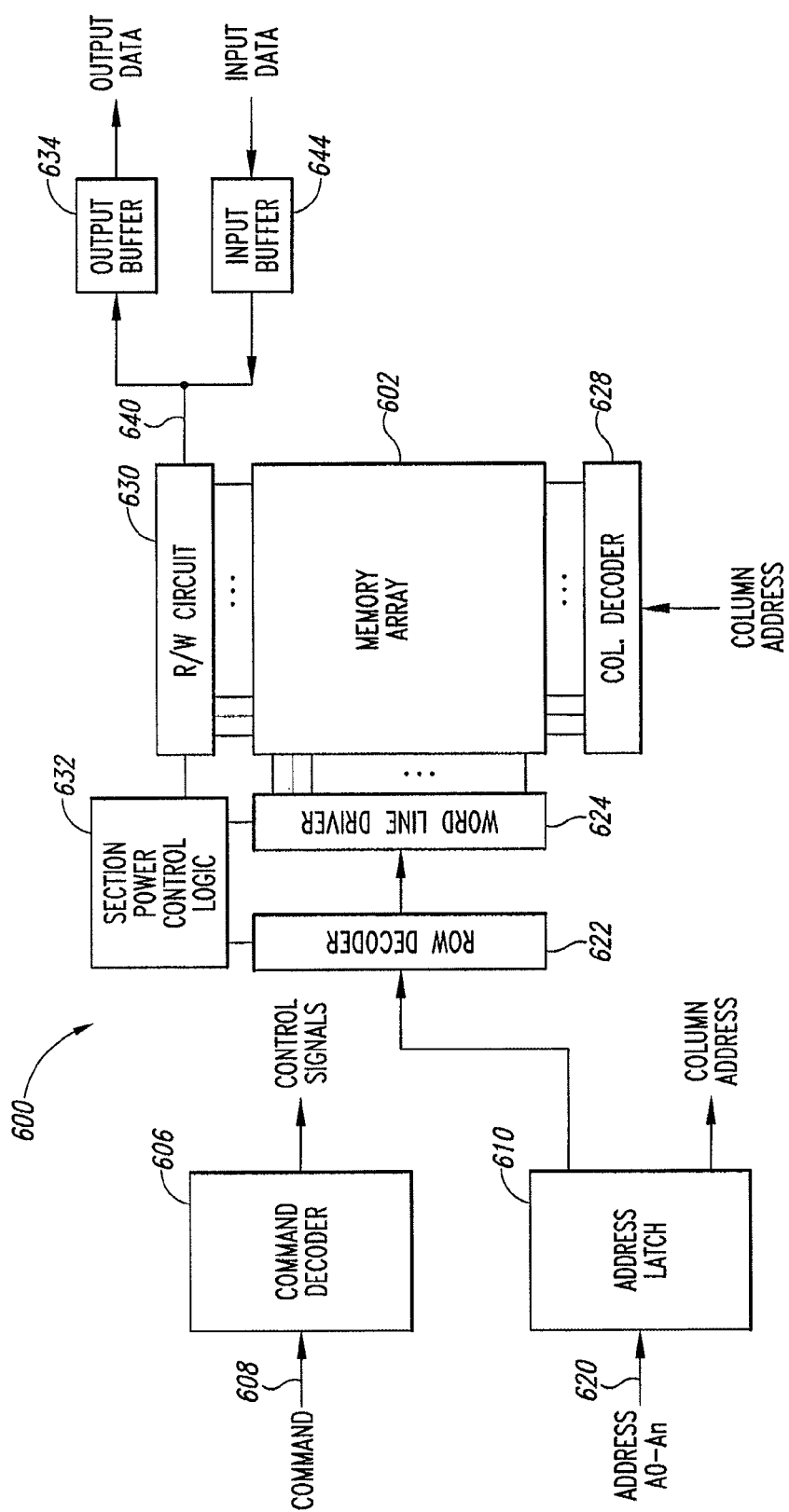
FIG. 4 is a block diagram of a memory according to an embodiment of the invention.

FIG. 4 illustrates a portion of a memory system 600 according to an embodiment of the present invention. The memory system 600 includes an array 602 of memory cells, which may be, for example, DRAM memory cells, SRAM memory cells, flash memory cells, or some other types of memory cells. The array 602 includes memory sections as previously described. The memory system 600 includes a command decoder 606 that receives memory commands through a command bus 608 and generates corresponding control signals within the memory system 600 to carry out various memory operations. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The row address decoder 622 includes row address decoder circuitry for selection of memory cells of each of the memory sections of the array 602. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630. Memory section power control logic 632 selectively couples the local power domains for the memory sections to a primary power supply when the respective memory section is to be accessed. The local power domains provide power to memory section access circuitry, for example, a memory section row decoder, sense amplifiers and sense amplifier gap control logic. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory array, comprising:
    a section of memory cells;
    decoder circuits coupled to memory cells of the section;
    power control logic configured to selectively couple power to the decoder circuits in response to memory addresses; and
    an isolation circuit configured to provide known logic levels to the decoder circuits during at least a portion of a time the decoder circuits are not coupled to power.

2. The memory array of claim 1, further comprising sense amplifiers coupled to the memory cells of the section.

3. The memory array of claim 1 wherein the isolation circuit is coupled to the sense amplifiers and configured to provide thereto output signals having known logic levels during the time the decoder circuits are not coupled to power.

4. The memory array of claim 1 wherein the isolation circuit comprises:
    a first logic gate configured to generate a first output signal having a first logic level while the decoder circuits are not coupled to power; and
    a second logic gate configured to generate a second output signal having a second logic level complementary to the first logic level.

5. The memory array of claim 1 wherein the decoder circuits comprises row decoder circuits.

6. The memory array of claim 2 wherein the section of memory cells is a first section of memory cells and the memory array further comprises a second section of memory cells, the sense amplifiers coupled to the memory cells of the first and second sections of memory cells.

7. The memory array of claim 1 wherein the power control logic comprises section selection logic configured to receive internal address signals based on external memory addresses and configured to selectively couple power in accordance therewith.

8. A memory, comprising
    a memory array, the memory array having a plurality of memory sections in which memory cells are arranged in rows and columns;
    a plurality of sets of sense amplifiers, each set coupled to the columns of memory cells of at least one memory section; and
    power control logic coupled to respective sets of sense amplifiers and configured to selectively decouple the sense amplifier from receiving electrical power, the power control logic comprising an isolation circuit coupled to the set of sense amplifiers and configured to provide thereto output signals having known logic levels during a time the sense amplifiers are not coupled to power.

9. The memory of claim 8 wherein the isolation circuit is coupled to decoder circuits and configured to provide thereto output signals having known logic levels during the time the sense amplifiers are not coupled to power.

10. The memory of claim 8 wherein the isolation circuit is coupled to a switch and configured to provide a signal to the switch to decouple the set of sense amplifiers from electrical receiving power.

11. The memory of claim 8, further comprising a plurality of row decoder circuits, each row decoder circuit coupled to the rows of a respective memory section and configured to select a row of memory cells according to a memory address.

12. The memory of claim 11 further comprising a plurality of local power domains having a local power rail coupled to the row decoders and the set of sense amplifiers.

13. The memory of claim 12 wherein the power control logic comprises:
    a switch configured to connect the local power rail to the primary power supply when activated; and
    a logic circuit coupled to receive internal memory address signals and configured to activate the switch in response to the memory address corresponding to the respective memory section.

* * * * *